United States Patent
Reynolds

(10) Patent No.: US 10,293,365 B2
(45) Date of Patent: May 21, 2019

(54) ELECTRICALLY CONDUCTIVE PATTERN PRINTER FOR DOWNHOLE TOOLS

(71) Applicant: Halliburton Energy Services, Inc, Houston, TX (US)

(72) Inventor: Robert L. Reynolds, Cypress, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/327,827

(22) PCT Filed: Sep. 18, 2014

(86) PCT No.: PCT/US2014/056309
§ 371 (c)(1),
(2) Date: Jan. 20, 2017

(87) PCT Pub. No.: WO2016/043750
PCT Pub. Date: Mar. 24, 2016

(65) Prior Publication Data
US 2017/0203325 A1   Jul. 20, 2017

(51) Int. Cl.
| | |
|---|---|
| *B05D 1/00* | (2006.01) |
| *B05D 1/02* | (2006.01) |
| *C09D 5/00* | (2006.01) |
| *G01V 3/26* | (2006.01) |
| *H01Q 1/04* | (2006.01) |
| *C09D 11/52* | (2014.01) |

(Continued)

(52) U.S. Cl.
CPC ............... *B05D 1/00* (2013.01); *C09D 5/00* (2013.01); *C09D 11/037* (2013.01); *C09D 11/52* (2013.01); *E21B 17/003* (2013.01); *H01Q 1/04* (2013.01); *B05D 1/02* (2013.01); *G01V 3/26* (2013.01)

(58) Field of Classification Search
CPC .......... H01Q 1/04; B05D 1/02; E21B 17/003; G01V 3/26
USPC .............................. 427/58, 117, 425
See application file for complete search history.

(56) References Cited

U.S. PATENT DOCUMENTS

| | | | | |
|---|---|---|---|---|
| 4,319,191 A | * | 3/1982 | Meador | G01V 3/28 324/338 |
| 6,690,170 B2 | * | 2/2004 | Homan | G01V 3/28 324/339 |
| 8,632,150 B2 | | 1/2014 | Kasai et al. | |

(Continued)

FOREIGN PATENT DOCUMENTS

| | | |
|---|---|---|
| EP | 1 369 245 A1 | 12/2003 |
| JP | 2004/284340 A | 10/2004 |

OTHER PUBLICATIONS

International Search Report and The Written Opinion of the International Search Authority, or the Declaration, dated Jun. 15, 2015, PCT/US2014/056309, 9 pages, ISA/KR.

(Continued)

*Primary Examiner* — Brian K Talbot
(74) *Attorney, Agent, or Firm* — Haynes and Boone, LLP

(57) ABSTRACT

A device which prints an electrically conductive pattern on a downhole tool using electrical ink includes a print head assembly and gripper claw assembly to print and manipulate the downhole tool during printing, respectively. The electrically conductive pattern may be an antenna coil, circuit or other desired pattern. After printing, the accuracy of the pattern is verified by the system and an impact resistant coating is applied to the pattern.

9 Claims, 4 Drawing Sheets

(51) Int. Cl.
*E21B 17/00* (2006.01)
*C09D 11/037* (2014.01)

(56) References Cited

U.S. PATENT DOCUMENTS

| | | | |
|---|---|---|---|
| 8,633,472 B2 | 1/2014 | Boulaevskii et al. | |
| 2003/0184488 A1* | 10/2003 | Smith | G01V 3/28 |
| | | | 343/787 |
| 2003/0189617 A1 | 10/2003 | Mott et al. | |
| 2005/0109098 A1* | 5/2005 | DiFoggio | E21B 47/10 |
| | | | 73/152.55 |
| 2008/0030415 A1 | 2/2008 | Homan et al. | |
| 2009/0015253 A1 | 1/2009 | Forgang et al. | |
| 2009/0034881 A1* | 2/2009 | Lapstun | G06K 9/0004 |
| | | | 382/321 |
| 2012/0111633 A1* | 5/2012 | Kumar | E21B 47/0006 |
| | | | 175/50 |
| 2012/0321795 A1 | 12/2012 | Gullentops | |

OTHER PUBLICATIONS

Talbot, "Graphene Antennas Would Enable Terabit Wireless Downloads," https://www.technologyreview.com/s/511726/graphene-antennas-would-enable-terabit-wireless-download/#UTY-IKGip50.facebook.

\* cited by examiner

ELECTRICALLY CONDUCTIVE PATTERN PRINTER FOR DOWNHOLE TOOLS

PRIORITY

The present application is a U.S. National Stage patent application of International Patent Application No. PCT/US2014/056309, filed on Sep. 18, 2014, the benefit of which is claimed and the disclosure of which is incorporated herein by reference in its entirety.

FIELD OF THE DISCLOSURE

The present disclosure generally relates to the fabrication of downhole tools and, more particularly, to a device which prints electrically conductive patterns on downhole tools.

BACKGROUND

Currently, wires of various sizes are being used to create antennas on downhole tools. The size of the wires, however, restricts the diameter of the downhole tool given the limited borehole space. In addition, protection of the antenna coils and circuitry from the harsh downhole environment is always a concern.

DESCRIPTION OF ILLUSTRATIVE EMBODIMENTS

Illustrative embodiments and related methodologies of the present disclosure are described below as they might be employed for a device to print electrically conductive patterns on surfaces of downhole tools. In the interest of clarity, not all features of an actual implementation or methodology are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methodologies of the disclosure will become apparent from consideration of the following description and drawings.

As described herein, embodiments of the present disclosure are directed to a device that prints electrically conductive patterns on downhole tools. In a generalized embodiment of the present disclosure, the printing device includes a print head assembly and a gripper claw assembly. The print head assembly includes a reservoir containing electronic ink such as, for example, graphene ink. The gripper claw assembly includes one or more gripper claws that each have a first and second opposing claw that work in tandem to grip the downhole tool as the print head assembly prints an electrically conductive patters on the surface of the downhole tool using the electronic ink. Each gripper claw includes frictional balls which rotate while the claws are closed around the tool and, as a result, the downhole tool is rotates or moves axially as desired.

In a generalized method of the present disclosure, the downhole tool is placed into the gripper claw assembly and the print head assembly begins printing the electrically conductive pattern. In certain methods, the electrically conductive pattern is an antenna, cable, wire, circuit, etc. for use in a downhole tool. During printing, the print head assembly moves and/or the gripper claw assembly manipulates the downhole tool in order to perform printing. Once the pattern is printed, a sensor positioned on the print head assembly is utilized to determine if the pattern was printed correctly. Once accuracy is confirmed, the print head assembly applied an impact resistant coating to the electrically conductive pattern in order to protect it from harsh downhole conditions.

Figure 1:
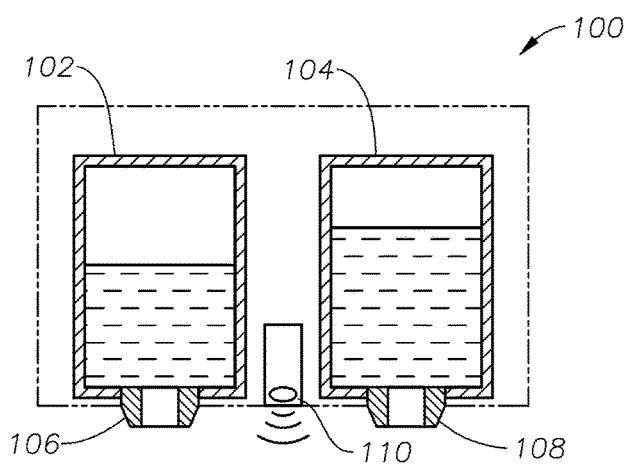
FIG. 1 is a block diagrammatical illustration of a print head assembly utilized in an illustrative device of the present disclosure.

FIG. 1 is a block diagrammatical illustration of a print head assembly utilized in an illustrative device of the present disclosure. Print head assembly 100 includes a first reservoir 102 containing electronic ink, such as, for example, graphene ink. A second reservoir 104 is also provided that contains another material (impact resistant coating, e.g.) that is applied to the electronically conductive pattern, as will be described below. In other embodiments, three or more reservoirs may also be utilized. In yet other illustrative embodiments, the impact resistant coating is an epoxy. First and second reservoirs 102,104 are in fluid communication with nozzles 106 and 108, respectively. During operation, the electrically conductive ink and impact resistant coatings are applied to the downhole tool via nozzles 106,108.

Print head assembly 100 also includes a sensor 110 to detect the position of print head assembly 100 along the downhole tool during printing. In certain embodiments, this is achieved using a pre-programmed start position (also referred to herein as "position zero") to determine the start point for a conductive pattern. Sensor 110 may be, for example, camera sensors, photoelectric laser, or heat sensors. Furthermore, although not shown, a positioning system is coupled to print head assembly 100 in order to move it along the downhole tool during printing. Such a positioning system may include electrical and/or hydraulic components to achieve precision positioning, as would be understood by those ordinarily skilled in the art having the benefit of this disclosure.

Figure 2A:
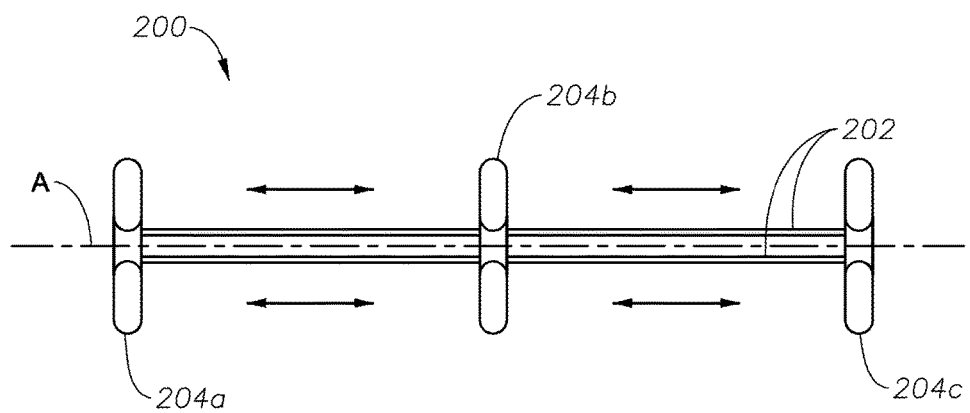
FIG. 2A is a top-side view of a gripper claw assembly utilized in an illustrative device of the present disclosure.

FIG. 2A is a top-side view of a gripper claw assembly utilized in an illustrative device of the present disclosure. In this embodiment, gripper claw assembly 200 includes a track 202, along which three gripper claws 204a, 204b and 204c are attached. Track 202 has an axis A along which gripper claws 204a-c move during operation. In other embodiments, however, gripper claw assembly 200 may include more or less number of gripper claws 204. In operation, gripper claws 204a and 204c hold both ends of the downhole tool, while gripper claw 204b is primarily used to stabilize the tool.

Figure 2C:
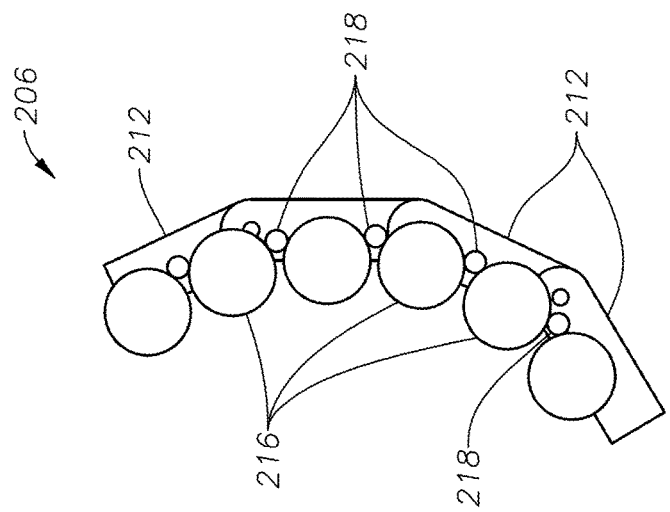
FIG. 2C is an isolated view of a claw of an illustrative gripper claw of the present disclosure.
Figure 2B:
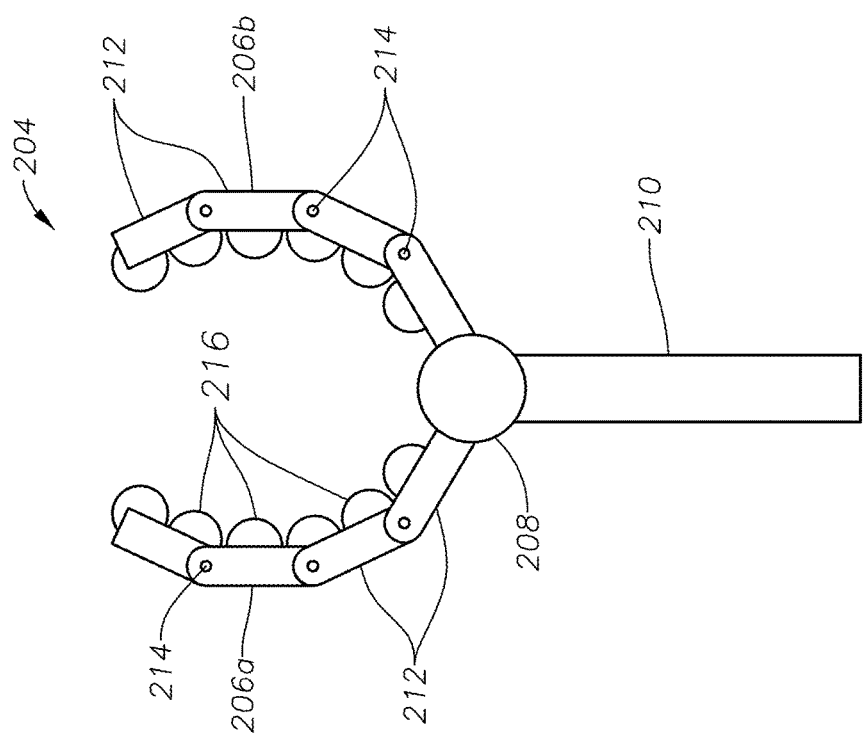
FIG. 2B illustrates an isolated view of a gripper claw according to an illustrative embodiment of the present disclosure.

FIG. 2B illustrates an isolated view of a gripper claw 204. In this embodiment, gripper claw 204 includes a first claw 206a and a second opposing claw 206b. During operation, first and second claws 206a,b work in tandem to grip the downhole tool as print head assembly 100 prints the electrically conductive pattern on the tool using the electronic ink. In certain embodiments, first and second claws 206a,b are sized and/or adjusted to fit at least seventy-five percent of the tools surface. First and second claws 206a,b are made of various joints 212 connected to one another using, for example, pins 214. On the underside of joints 212 are connected a plurality of friction balls 216 which grip the downhole tool during operation. Gripper claw 204 includes a joint 208 which allows first and second claws 206a,b to close in relation to one another. An arm 210 is connected to joint 208 and, although not shown, arm 210 is connected to track 202 whereby the axial movement (along axis A) previously described is achieved.

FIG. 2C is an isolated view of a claw of an illustrative gripper claw of the present disclosure. In this view, friction balls 216 are shown in greater detail. In certain embodiments, friction balls 216 are made of rubber, while in other embodiments any variety of frictional materials may be utilized. In order to rotate friction balls 216, a plurality of motors 218 are also provided on gripper claw 206 in order to drive friction balls 216. In alternate embodiments, however, more than one friction ball 216 may be coupled to a single motor 218.

Although not shown, the printing devices of the present disclosure are coupled to and control using processing circuitry. Such processing circuitry would comprise a signal processor, communications module and other circuitry necessary to achieve the objectives of the present disclosure, as will be understood by those ordinarily skilled in the art having the benefit of this disclosure. In addition, it will also be recognized that the software instructions necessary to carry out the objectives of the present disclosure may be stored within storage located within the processing circuitry or loaded into that storage from a CD-ROM or other appropriate storage media via wired or wireless methods.

Figure 3:
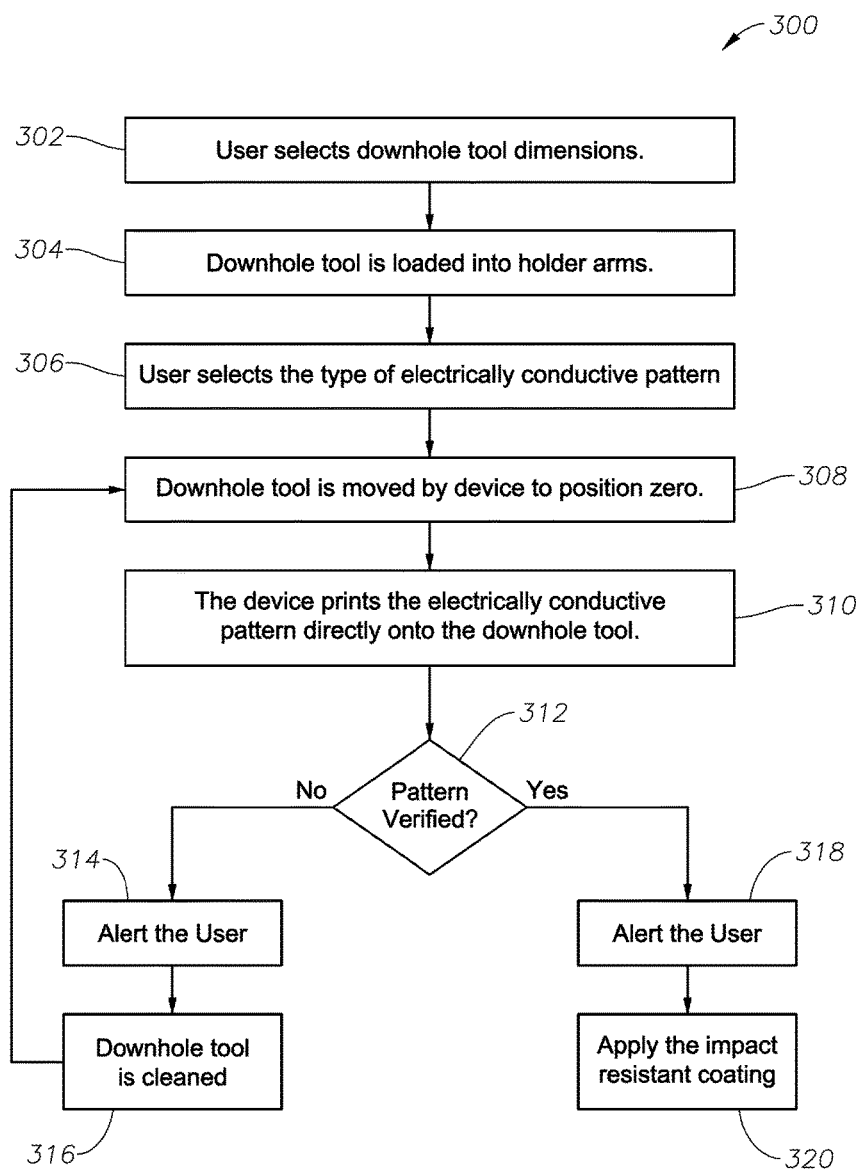
FIG. 3 is a flow chart of a method of printing an electrically conductive pattern on a downhole tool, according to certain illustrative methods of the present disclosure.

FIG. 3 is a flow chart of a method of printing an electrically conductive pattern on a downhole tool, according to certain illustrative methods of the present disclosure. At block 302 of method 300, a user selects the dimensions of the downhole tools. The downhole tool may be, for example, a logging or drilling tool, sub, module or other desired downhole component or tubular. The dimensional selection may be made, for example, via a graphical user interface displayed on a monitor. At block 304, the downhole tool is loaded into gripper claw assembly 200 by, for example, manually feeding the drill tool to be used into the claws or using a hoist system to lift the drill tool into place. Alternatively, an automated system could be used to not only lift but remove the drilling tool in a similar fashion as a factory line where a grabbing clamp system picks up the item to be moved and places it into position. At block 306, a user selects (via the user interface) the type of electrically conductive pattern to be printed on the downhole tool. As previously described, the electrically conductive pattern may be, for example, a downhole antenna, circuit or other desired electrical component. In certain methods, the chosen electrically conductive patterns may be based upon customer requirement.

At block 308, the downhole tool is moved to a position zero, which is the beginning point where print head assembly 100 will begin printing the electrically conductive pattern. In certain embodiments, position zero is the position along the tool that connects to the motherboard or other internal device which requires use of the electrically conductive pattern. This connection may be bypassed with proper plotting in one of the many types of three-dimensional visualization software platforms, such as, for example, AutoCAD® before the printing device begins printing. In certain instances, it may be necessary to bypass the connection, such as, for example, when performing system maintenance.

Still referring to block 308, movement of the downhole tool may be achieved in various ways. For example, the downhole tool may be rotated by friction balls 216 while gripper claw 204 is gripping the tool. In other methods, the downhole tool may be moved along axis A (FIG. 2A) by rotation of friction balls 216. Therefore, in such methods, friction balls 216 will be configured to rotate on various axes. In yet another method, print head assembly 100 may be moved along the downhole tool using the positioning system (not shown), as previously described. In yet another method, with reference to FIG. 2A, movement of the downhole tool in relation to print head assembly 100 is achieved by moving gripper claws 204a-c along track 10. Moreover, in other methods, any combination of these movements may be applied to achieve the printing.

Referring back to FIG. 3, at block 310, print head assembly 100 prints the electrically conductive pattern onto the downhole tool. At block 312, the printing device, via the processing circuitry/software described above, determines whether the electrically conductive pattern was printed correct (i.e., verifies the pattern). In certain methods, this verification is accomplished using sensor 106 (e.g., a photoelectric laser sensor, image sensor, heat-based sensor, etc.) to measure the newly printed pattern to verify it is the correct size and length as entered in block 306 (i.e., there is a match between the entered and printed patterns). In certain embodiments, the verification is achieved by retracing the print head assembly 100 from the end of the electrically conductive pattern back to the position zero. During the retracement, sensor 110 analyzes the pattern to locate any discontinuities which might prevent electrical signals from propagating along the pattern during use. Alternatively, a heat sensor may be used to sense the temperature of the ink along the drilling tool versus the temperature of the tool itself. The temperature changes along the tool could be utilized to determine flaws in the conductive pattern.

If the printing device determines the electrically conductive pattern was incorrectly applied, the printing device generates an alert, such as, for example, an audible, visual or textual alert at block 314. At block 316, the downhole tool is then cleaned and the process loops back to block 308. In certain embodiments, the cleaning may be accomplished by manually scrubbing the drilling tool or using a high pressure wash using water.

However, if at block 312 the printing device determines the electrically conductive pattern is correctly applied, the system may also alert the user of this condition at block 318. At block 320, print head assembly 100 then applies an impact resistant coating (starting at position zero) to the electrically conductive pattern in order to protect is from downhole conditions. In addition to downhole impacts, the impact resistant coating is also resistant to high downhole temperatures and pressure of at least 5K psi. Such coatings may be, for example, an epoxy coating or even a metallic coating which does not unduly effect downhole signaling. In an alternative embodiment, however, an impact resistant "window" or other form of protective sleeve may be placed over the conductive pattern to protect it against damage.

Figure 4A:
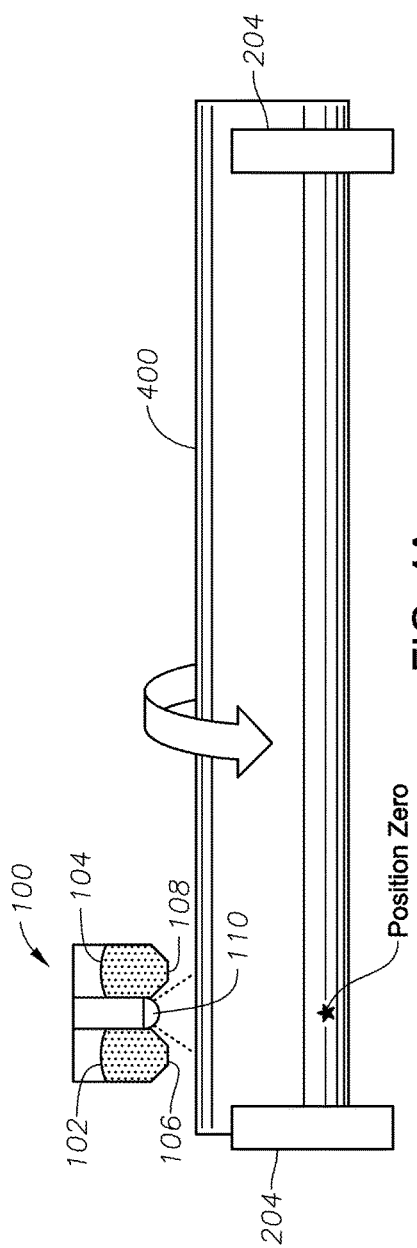
FIGS. 4A-4B graphically illustrate a printing method of the present disclosure.
Figure 4B:
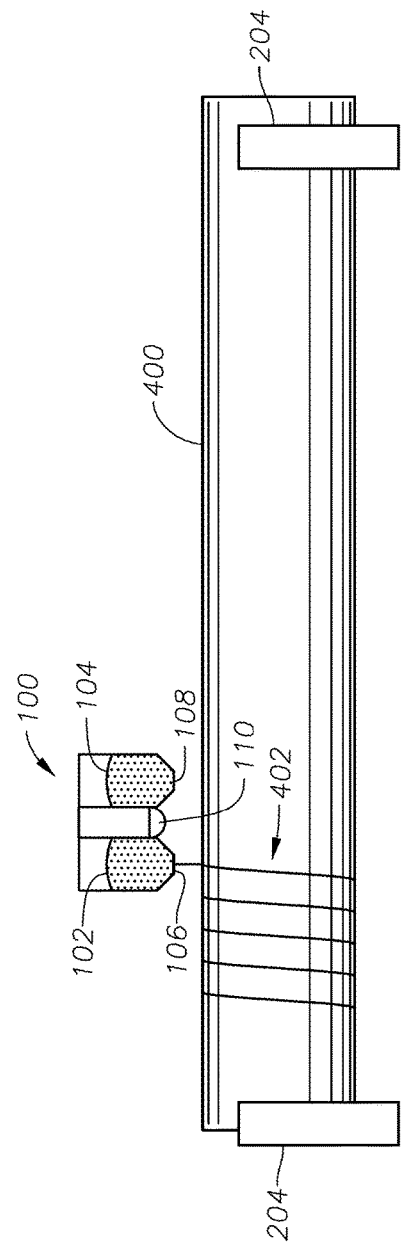

FIGS. 4A-4B graphically illustrate a printing method of the present disclosure. In FIG. 4A, gripper claws 204 are rotating downhole tool 400 vertically while using sensor 110 to locate Position Zero in order to begin printing. In FIG. 4B, Position Zero has been located and print head assembly 100 has printed conductive pattern 402 as a basic coil wrap around downhole tool 400. Note, however, that in other embodiments the conductive pattern may be any number of designs, such as, for example, fractal antenna designs. Once conductive pattern 402 has been printed, print head assembly 100 will use sensor 110 to verify that the pattern is correct and complete. Once this has been confirmed, print head assembly 100 will return to Position Zero and begin the process of coating conductive pattern 402. Once print head assembly 100 has return to Position Zero, the protective coating is then applied.

Accordingly, through use of illustrative embodiments of the present disclosure, various electrically conductive patterns are printed on downhole tools. As a result, the diameter of a downhole tool is less-restrictive due to the added internal space for parts or other sensor in the wellbore created through use of the printed patterns. Furthermore, once printed, the impact resistant coating provides protection from the downhole environment.

Embodiments and methods described herein further relate to any one or more of the following paragraphs:
1. A device to print an electrically conductive pattern on a downhole tool, the device comprising a print head assembly comprising a first reservoir containing electronic ink; and a gripper claw assembly having at least one gripper claw comprising: a first claw; and a second opposing claw, wherein the first and second claws operate in tandem to grip the downhole tool as the print head assembly prints the electrically conductive pattern on the downhole tool using the electronic ink.
2. A device as defined in paragraph 1, wherein the print head assembly further comprises a second reservoir.
3. A device as defined in paragraphs 1 or 2, wherein the second reservoir contains an impact resistant coating that is applied to the electrically conductive pattern.
4. A device as defined in any of paragraphs 1-3, wherein the print head assembly further comprises a sensor to detect a position of the print head along the downhole tool.
5. A device as defined in any of paragraphs 1-4, wherein the electronic ink is graphene ink.
6. A device as defined in any of paragraphs 1-5, wherein the gripper claw assembly comprises three gripper claws.
7. A device as defined in any of paragraphs 1-6, wherein the gripper claw assembly further comprises an arm connected to the gripper claw; and a track connected to the arm, wherein the track is configured to allow the gripper claw to move along an axis of the track.
8. A device as defined in any of paragraphs 1-7, wherein the first and second claws comprise frictional balls to grip the downhole tool.
9. A device as defined in any of paragraphs 1-8, further comprising a motor connected to the friction balls to rotate the friction balls, thereby resulting in movement of the downhole tool.
10. A device as defined in any of paragraphs 1-9, further comprising a positioning system to move the print head assembly along the downhole tool.
11. A device as defined in any of paragraphs 1-10, wherein the electrically conductive pattern is an antenna.
12. A device as defined in any of paragraphs 1-11, wherein the downhole tool is a logging tool, drilling tool, sub, or component of a downhole tool.
13. A method for printing an electrically conductive pattern on a downhole tool, the method comprising printing an electrically conductive pattern on a downhole tool using a print head assembly; and applying an impact resistant coating to the electrically conductive pattern using the print head assembly.
14. A method as defined in paragraph 13, wherein printing the electrically conductive pattern further comprises utilizing a sensor positioned on the print head assembly to determine if the electrically conductive pattern was applied correctly.
15. A method as defined in paragraphs 13 or 14, further comprising generating an alert if the electrically conductive pattern was applied incorrectly.
16. A method as defined in any of paragraphs 13-15, wherein printing the electrically conductive pattern comprises selecting dimensions for the downhole tool; selecting a pattern for the electrically conductive pattern; positioning the print head assembly at a position zero; and printing the electrically conductive pattern based upon the selected pattern.
17. A method as defined in any of paragraphs 13-16, wherein determining whether the electrically conductive pattern was applied correcting comprises retracing the print head assembly from an end of the electrically conductive pattern back to the position zero; and utilizing the sensor to determine if there are any discontinuities in the electrically conductive pattern.
18. A method as defined in any of paragraphs 13-17, further comprising utilizing the sensor to determine if the electrically conductive pattern matches the selected pattern.
19. A method as defined in any of paragraphs 13-18, wherein printing the electrically conductive pattern comprises at least one of rotating the downhole tool using a gripper claw assembly; moving the downhole tool along an axis of the downhole tool using the gripper claw assembly; or manipulating the print head assembly along the downhole tool using a positioning mechanism.
20. A method as defined in any of paragraphs 13-19, wherein the rotation and axial movement of the downhole tool is achieved by powering friction balls of the gripper claw assembly such that the friction balls rotate.
21. A method as defined in any of paragraphs 13-20, wherein the movement along the axis of the downhole tool is accomplished by moving the gripper claw assembly along a track.

Although various embodiments and methodologies have been shown and described, the disclosure is not limited to such embodiments and methodologies and will be understood to include all modifications and variations as would be apparent to one skilled in the art. Therefore, it should be understood that embodiments of the disclosure are not intended to be limited to the particular forms disclosed. Rather, the intention is to cover all modifications, equivalents and alternatives falling within the spirit and scope of the disclosure as defined by the appended claims.

What is claimed is:
1. A method for printing an electrically conductive pattern on a downhole tool, the method comprising:

printing an electrically conductive pattern on a downhole tool using a print head assembly, wherein the printing the electrically conductive pattern comprises at least one of:

rotating the downhole tool using a gripper claw assembly; or moving the downhole tool along an axis of the downhole tool using the gripper claw assembly; and applying an impact resistant coating to the electrically conductive pattern using the print head assembly.

2. A method as defined in claim 1, wherein printing the electrically conductive pattern further comprises utilizing a sensor positioned on the print head assembly to determine if the electrically conductive pattern was applied correctly.

3. A method as defined in claim 2, further comprising generating an alert if the electrically conductive pattern was applied incorrectly.

4. A method as defined in claim 2, wherein printing the electrically conductive pattern comprises:

selecting dimensions for the downhole tool;

selecting a pattern for the electrically conductive pattern;

positioning the print head assembly at a position zero; and printing the electrically conductive pattern based upon the selected pattern.

5. A method as defined in claim 4, wherein determining whether the electrically conductive pattern was applied correcting comprises:

retracing the print head assembly from an end of the electrically conductive pattern back to the position zero; and utilizing the sensor to determine if there are any discontinuities in the electrically conductive pattern.

6. A method as defined in claim 5, further comprising utilizing the sensor to determine if the electrically conductive pattern matches the selected pattern.

7. A method as defined in claim 1, wherein printing the electrically conductive pattern further comprises manipulating the print head assembly along the downhole tool using a positioning mechanism.

8. A method as defined in claim 1, wherein the rotation and/or axial movement of the downhole tool is achieved by powering friction balls of the gripper claw assembly such that the friction balls rotate.

9. A method as defined in claim 1, wherein the printing the electrically conductive pattern comprises the moving the downhole tool along the axis of the downhole tool using the gripper claw assembly, and wherein the movement along the axis of the downhole tool is accomplished by moving the gripper claw assembly along a track.

* * * * *